(12) United States Patent
Yeh

(10) Patent No.: US 6,441,883 B1
(45) Date of Patent: Aug. 27, 2002

(54) METHOD AND APPARATUS TO REDUCE BIAS BETWEEN DENSE AND SPARSE PHOTORESIST PATTERNS

(75) Inventor: Chin-teh Yeh, Taipei (TW)

(73) Assignee: ProMos Technologies Inc., Hsinchu (TW)

( * ) Notice: Subject to any disclaimer, the term of this patent is extended or adjusted under 35 U.S.C. 154(b) by 0 days.

(21) Appl. No.: 09/519,134

(22) Filed: Mar. 6, 2000

(51) Int. Cl.[7] ............................. G03B 27/42; G03B 27/72
(52) U.S. Cl. ............................................ 355/53; 355/71
(58) Field of Search ........................... 355/53, 71, 55; 430/5, 22, 30, 396, 322; 359/580

(56) References Cited

U.S. PATENT DOCUMENTS

| | | | | |
|---|---|---|---|---|
| 5,256,505 A | * | 10/1993 | Chen et al. | 430/5 |
| 5,288,569 A | * | 2/1994 | Lin | 430/5 |
| 5,447,810 A | * | 9/1995 | Chen et al. | 430/5 |
| 5,593,801 A | * | 1/1997 | Yoshioka et al. | 430/5 |
| 5,756,238 A | * | 5/1998 | Barr et al. | 430/5 |
| 6,048,647 A | * | 4/2000 | Miyazaki et al. | 430/5 |
| 6,077,633 A | * | 6/2000 | Lin et al. | 430/5 |
| 6,106,979 A | * | 8/2000 | Pierrat | 430/5 |
| 6,304,317 B1 | * | 10/2001 | Taniguchi et al. | 355/53 |

* cited by examiner

*Primary Examiner*—Alan A. Mathews
(74) *Attorney, Agent, or Firm*—Christensen O'Connor Johnson Kindness PLLC

(57) ABSTRACT

A method and apparatus to eliminate bias between dense and sparse patterns of photoresist images is presented. By placing an attenuator along the optical axis of a photolithography mask and its projected image, the intensity of radiation passing through a sparse pattern of the photolithography mask is attenuated so that the intensity of the projected sparse pattern falls within the same range as the intensity of radiation that passes the dense pattern of the photolithography mask. In this way, the bias between dense patterns and sparse patterns caused by differing radiation intensities during exposure is eliminated. The attenuator has both a transparent region and an attenuating region. The attenuating region is designed to attenuate only the sparse patterns projected from the photolithography mask. The attenuator is covered by materials that can attenuate the density of passed radiation to make the intensity of both low spatial frequency and high spatial frequency images fall within the same intensity range.

10 Claims, 4 Drawing Sheets

METHOD AND APPARATUS TO REDUCE BIAS BETWEEN DENSE AND SPARSE PHOTORESIST PATTERNS

FIELD OF THE INVENTION

This invention relates to the general field of photolithography with particular reference to correction of photoresist pattern bias.

BACKGROUND OF THE INVENTION

Photolithography is one of the most important steps in semiconductor manufacturing. Almost all components making up the structure of modern semiconductors are defined using photolithography. With the recent increases in component integration, the semiconductor industry is generally capable of using pattern lines of 0.25 µm or less. At this small size, the fidelity of the transfer of photolithography mask patterns to the photoresist plays a very important role. If the transfer of the mask pattern is not correct, it may introduce variances that exceed the tolerance of the critical dimension (CD) on the wafer.

The proximity effect causes a form of optical bias associated with photoresist images. For a given development time, whether or not a given area of a photoresist layer will be left or removed after the development process depends on the total amount of energy deposited in that area during its exposure to radiation.

The proximity effect can be compensated for, at least in part, by modifying any given feature in the opposite direction to the expected bias. Thus, a line that would otherwise come out too narrow can be drawn as wider than its true width, etc. The overall nature and scope of these corrections will vary with the particular photolithography process that is being used.

One solution to the proximity effect is the use of optical proximity correction (OPC). OPC compensates for the proximity effect by altering the mask image such that the resulting pattern matches the desired pattern of the non-altered mask image. OPC is commonly calculated by summing two Gaussian functions whose values depend on the CD defined by conventional design rules as well as on the wavelength of the exposing radiation. In general, the bias of lines that are part of a dense assemblage will be more positive than the bias of isolated (sparse) lines in optical mode. In the past, without the benefit of the current invention, there have been many attempts in mask designs to compensate for CD bias. However, none of those methods offer the simplicity of application provided by the present invention.

Consequently, a method and apparatus are desired which eliminate the need for different photolithography masks to compensate for bias between sparse and dense mask patterns. The method and apparatus should also eliminate the need to use more complicated design and production of OPC masks. As explained in the following, the present invention provides a method and system that meet these criteria and solve other problems in the prior art.

SUMMARY OF THE INVENTION

The present invention eliminates the need to compensate for bias between isolated and dense lines. This is accomplished by reducing the intensity of the radiation exposing the isolated lines to within the range of the intensity of the radiation exposing the dense lines. By placing an attenuator between a photolithography mask and its projected image, the intensity of radiation passing through a sparse pattern of the photolithography mask is attenuated so that the intensity of the projected sparse pattern falls within the same range as the intensity of radiation that passes the dense pattern of the photolithography mask. In this way, the bias between dense patterns and sparse patterns caused by differing radiation intensities during exposure is eliminated. The attenuator has both a transparent region and an attenuating region. The attenuating region is designed to attenuate only the radiation projected from the sparse patterns of the photolithography mask. The attenuator has materials on it that can attenuate the density of passed radiation to normalize the intensity of both low spatial frequency and high spatial frequency images such that they fall within the same intensity range.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
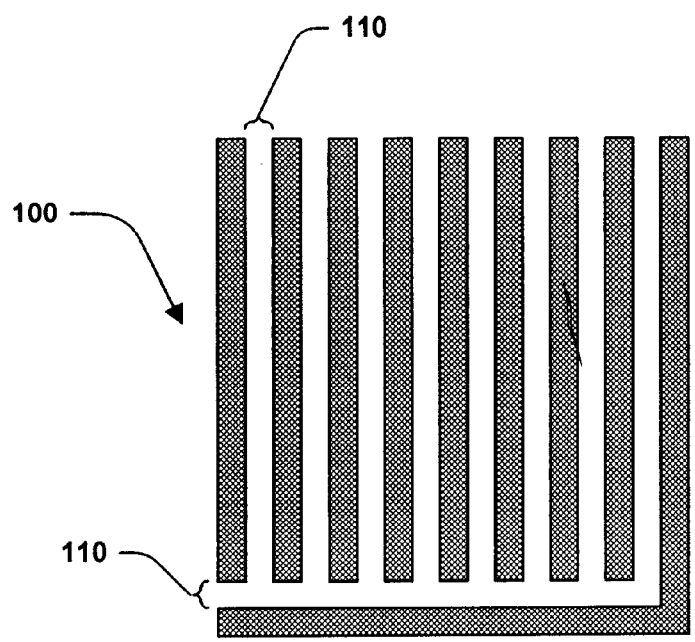
FIG. 1 is an idealized pattern for use in photoresist processing showing densely packed lines.
Figure 2:
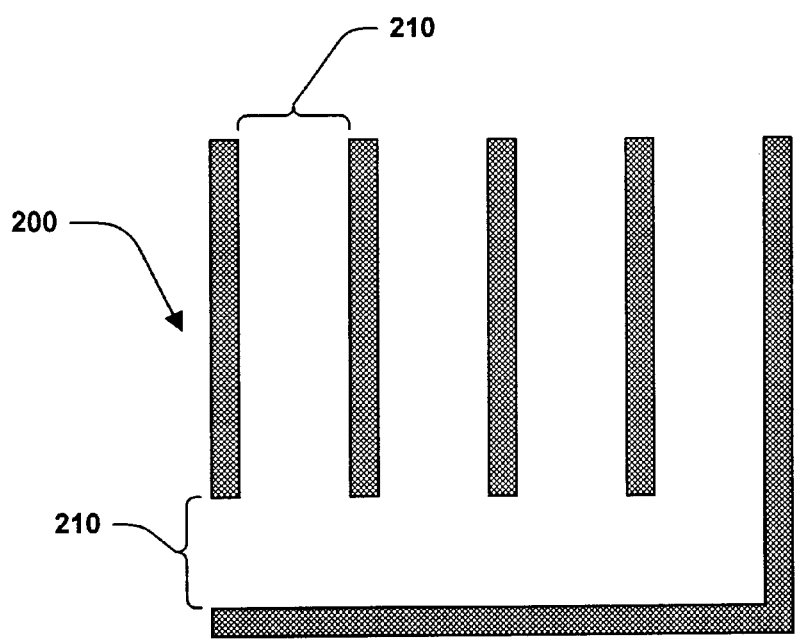
FIG. 2 is an idealized pattern for use in photoresist processing showing sparsely packed lines.

In many semiconductor products, the photolithography mask patterns may have very dense areas 100 as well as very sparse areas 200. The patterns shown in FIGS. 1 and 2 are provided as a way of simplifying the description of the present invention. In practicality, the patterns to which the present invention will often be applied will be substantially more complicated than those shown in FIGS. 1 and 2. However, it is not necessary that such complicated patterns be shown in order to disclose an actual embodiment for practicing the present invention. In general, mask patterns are made up of dense areas 100 where many lines are packed into small areas (such as in FIG. 1) and sparse areas 200 where most lines stand alone and are isolated (such as in FIG. 2). We can see that the line distance 110 of the dense pattern is smaller than the line distance 210 of the sparse pattern 200. Radiation passing through a dense area 100 of the mask 810 has a higher spatial frequency as indicated by point 520 in FIGS. 5 and 6. Radiation passing through a sparse area 200 of the mask 810 has a lower spatial frequency as indicated by points 510 and 610.

Figure 3:
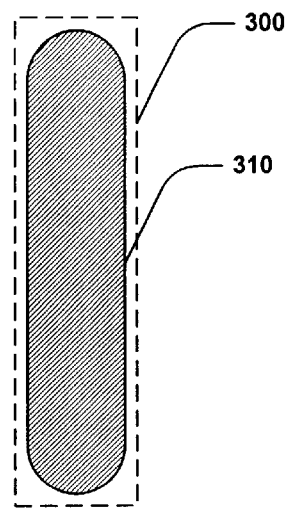
FIG. 3 shows a line segment affected by the proximity effect as it was transferred to photoresist.
Figure 4:
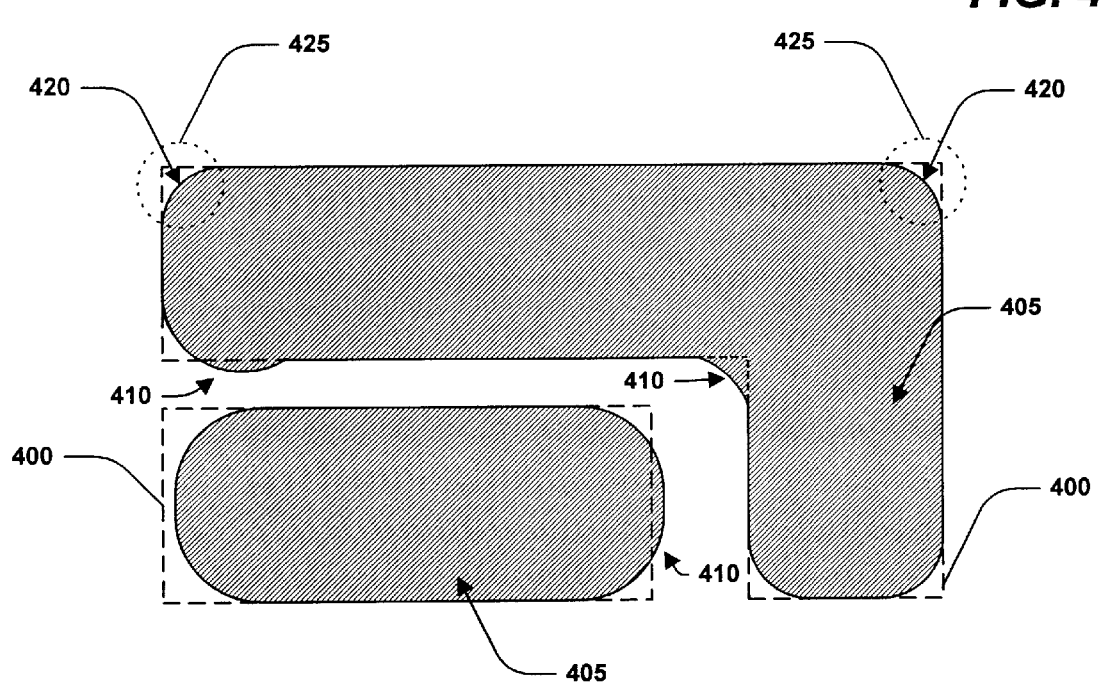
FIG. 4 shows a portion of a wafer with elements that have been distorted by the proximity effect.

FIGS. 3 and 4 illustrate pattern bias and CD variance caused by unmodified mask pattern transfers, including line end shorting, corner rounding, etc. In FIG. 3, the dashed line 300 is the line pattern projected on the substrate 830, while the shaded area is the line pattern 310 actually developed on the photoresist. Note that the line pattern 310 seems shorter than original pattern 300. The variance between the photoresist line pattern 310 and the projected line pattern 300 is a simple example of the proximity effect.

Other examples of the proximity effect are shown in FIG. 4, the dashed line 400 is the original pattern projected on the substrate 830, and the shadowed area is the resulting photoresist pattern 405. The corners 425 of photoresist pattern 405 may have flat rounding angles 420. Another result from the proximity effect is seen in the areas 410 that expand beyond the projected image.

Prior art methods have used OPC to eliminate the CD variance caused by the proximity effect. Theoretically, the radiation passing through an OPC mask that is projected onto a photoresist will form a photoresist pattern similar to the original pattern. However, as the transfer function of every stepper is different, the OPC mask must be redesigned for each stepper. Furthermore, when the exposure conditions within an individual stepper change, an OPC mask cannot compensate and must be redesigned.

In view of this situation, the present invention provides a method and apparatus to eliminate bias between dense patterns 100 and sparse patterns 200. Because the transfer functions of dense patterns 100 and sparse patterns 200 have different frequency responses, their intensity also differs. Generally, since a dense pattern 100 responds to a high spatial frequency, and a sparse pattern 200 responds to low spatial frequency, this may cause a significant bias between dense patterns 100 and sparse patterns 200 on a photoresist. The prior art methods for designing photolithography masks based on OPC do not consider the differences between the transfer functions of dense patterns 100 and sparse patterns 200.

The present invention places an attenuator along the optical axis of a mask and its projected image, to normalize the intensity of all radiation passed through the mask, so that the intensity falls within the intensity range of the radiation passing through the dense pattern of the photolithography mask. As described in more detail below, this will eliminate the bias between dense patterns 100 and sparse patterns 200 caused by differing radiation intensities during exposure.

Figure 5:
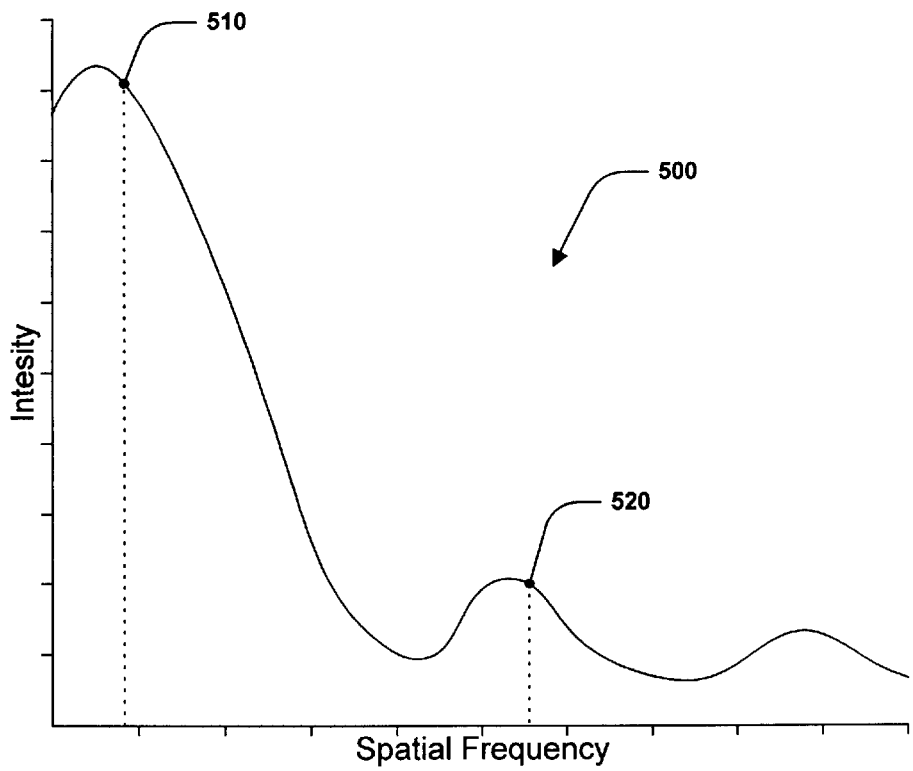
FIG. 5 shows in accordance with the present invention, a plurality of intensity values plotted as the transfer function of spatial frequency for an unattenuated optical apparatus.

FIG. 5 shows the relationship between spatial frequency and intensity of a dense pattern 100 and a sparse pattern 200. The spatial frequency of the sparse pattern 200 is low, but its intensity is high, as shown at point 510, while a dense pattern 100 has a high spatial frequency, but a low intensity, as shown at point 520. This difference in intensity will result in a bias between dense patterns 100 and sparse patterns 200 during the photolithography process. The intensity of the radiation passing through a sparse pattern 200 is stronger than that of a dense pattern 100 (less radiation is blocked by the mask in a sparse pattern). Therefore, while a sparse photoresist pattern has received enough exposure, a dense photoresist pattern will not have received enough. However, continuing to expose the photoresist until the dense pattern reaches its proper exposure level will result in an overexposed sparse pattern.

Figure 7:
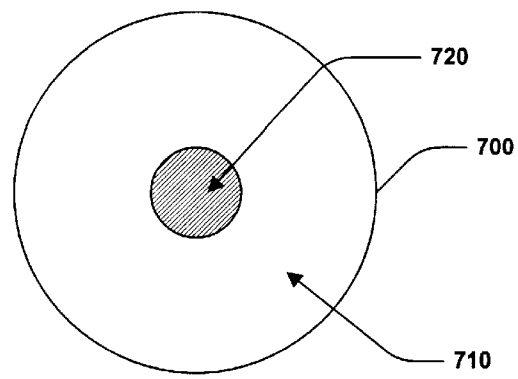
FIG. 7 illustrates a filter for attenuating high intensity radiation.

The present invention uses an attenuator 700 to decrease the intensity of the radiation passing through the sparse pattern 200, such that the radiation passing through both dense patterns 100 and sparse patterns 200 will fall within the same intensity range, thereby eliminating the bias caused by under or overexposure. FIG. 7 illustrates a design for the attenuator 700 in accordance with one actual embodiment of the present invention. The attenuator 700 includes a transparent region 710 and an attenuating region 720. By plating or coating some radiation blocking material, such as silver, on the attenuating region 720, it attenuates the intensity of specific portions of the radiation passing through the attenuator 700. The attenuation of the intensity of the radiation is proportional to the density of the plated material. Although the attenuator 700 in FIG. 7 shows the attenuating region 720 located in the center of the attenuator 700, it will be appreciated that the attenuating region 720 can be located anywhere on the attenuator 700. The location of the attenuating region 720 is determined by the areas of the attenuator 700 that will be exposed to higher intensity radiation.

Figure 6:
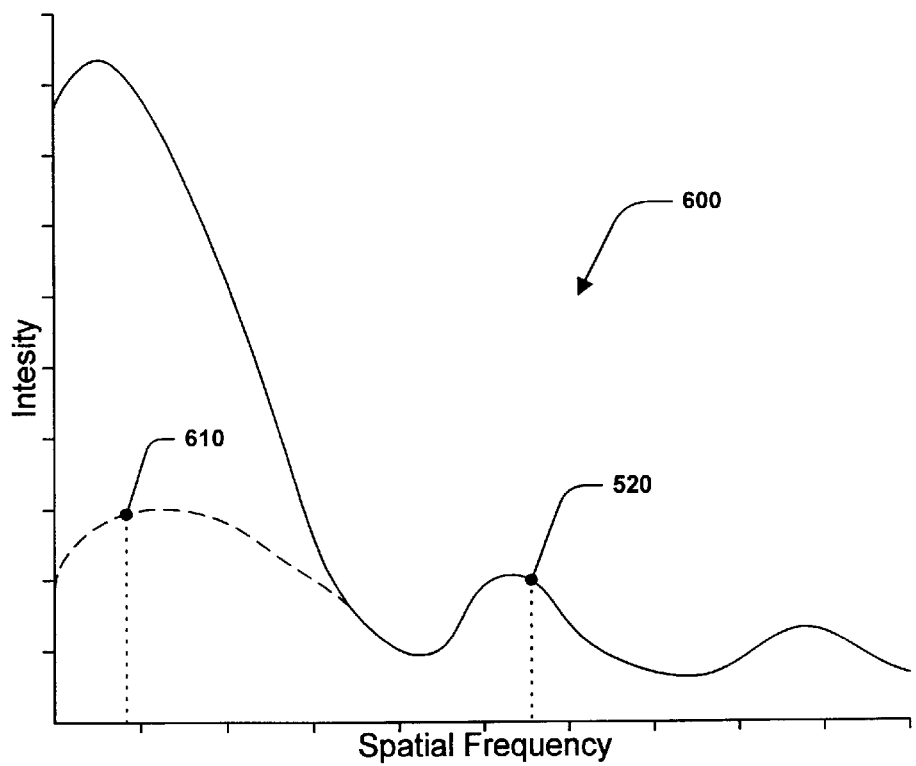
FIG. 6 shows in accordance with the present invention, a plurality of intensity values plotted as the transfer function of spatial frequency for an attenuated optical apparatus.

The effect of using attenuator 700 is shown in FIG. 6, which demonstrates the relationship between spatial frequency and intensity of dense patterns 100 and sparse patterns 200 after the radiation has been attenuated. For example, assume that radiation passing through a sparse pattern 200 of the mask 810 will pass the attenuating region 720 of the attenuator 700. After passing through the attenuator 700, the intensity of radiation passing through the sparse pattern 200 will fall within the same intensity range as radiation passing through the dense pattern 100 as indicated by the new point 610.

Figure 8:
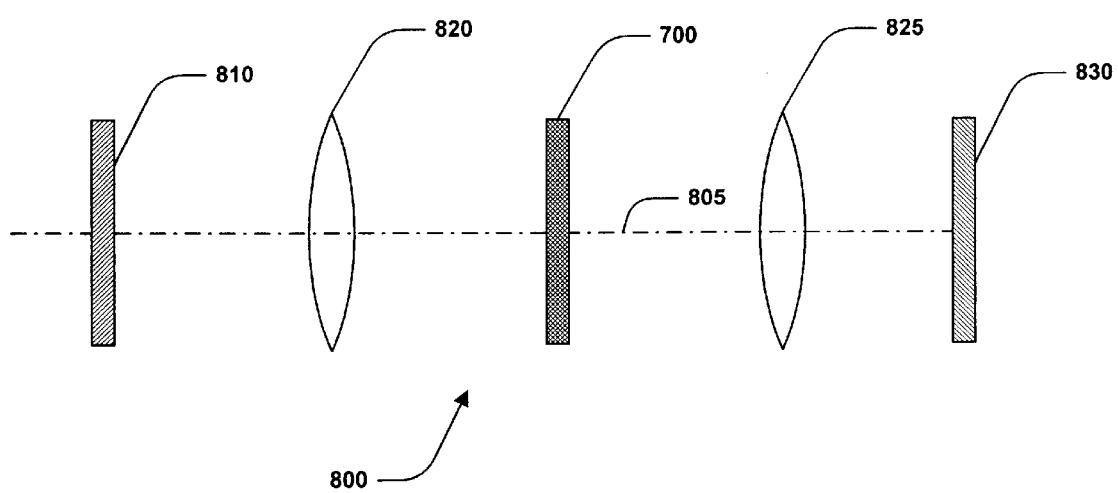
FIG. 8 is an illustration showing a portion of a projection system including an attenuator.

FIG. 8 shows a portion of a photoresist exposure apparatus 800 that illustrates the relationship between the lenses 820 and 825 of a stepper and the attenuator 700, mask 810, and substrate 830 along an optical axis 805. The attenuator 700 can be located between a first lens 820 and a second lens 825. In one embodiment, the photoresist exposure apparatus 800 uses radiation of 365 nm wavelength. However, as the need for smaller photoresist patterns increases, the photoresist exposure apparatus 800 could also uses radiation of smaller wavelengths, such as 248 nm or 198 nm.

In the actual embodiment of the present invention shown in FIG. 8, the attenuator 700 is located between the first lens 820 and the second lens 825 such that the distance from the first lens 820 to the attenuator 700 is equal to the focal length of the first lens 820, and the distance from the attenuator 700 to the second lens 825 is equal to the focal length of the second lens 825. This desirable arrangement of lenses takes advantage of a property of the Fourier Transfer Function in which low spatial frequency radiation passes through the central region of the attenuator 700. Therefore, by providing an attenuated region 720 substantially in the center of the attenuator, only the low spatial frequency radiation passing through the attenuator 700 is attenuated. The inverse Fourier Transform of the second lens may then be used to project the attenuated mask image onto the substrate 830.

Accordingly, an exemplary embodiment of the present invention uses a Canon® FPAEX3 stepper as the photoresist exposure apparatus 800. In this embodiment, the stepper 800 projects radiation with an exposure energy of 300 J/m$^2$ at a wavelength of 0.248 µm. The stepper 800 projects the radiation through a photolithography mask 810, thereby introducing special frequencies into the radiation from the patterns in the mask 810. The radiation passes through the mask 810 to a first lens 820 that has a focal length of 1 m. The radiation then passes though the first lens to an attenuator 700 that attenuates the intensity of the portion of the radiation having lower spatial frequencies. The radiation then passes through the attenuator 700 as attenuated radiation to a second lens 825. The second lens finally projects the attenuated radiation onto a photoresist 830. This embodiment uses a photoresist 830 of 5000 A thickness. In this embodiment, the resulting spatial frequency of the isolated pattern designated by point 510 in FIG. 5 would be 0.13 cycle/μm with an intensity of 8000 mW; and the spatial frequency of the dense pattern designated by point 520 in FIG. 5 would be 0.83 cycle/μm with an intensity of 7540 mW.

While the preferred embodiment of the invention has been illustrated and described, it will be appreciated that various changes can be made therein without departing from the spirit and scope of the invention. For example, even though the first lens 820 and the second lens 825 are referred to in the singular, one skilled in the arts would appreciate that either could be replaced by a lens assembly.

The embodiments of the invention in which an exclusive property or privilege is claimed are defined as follows:

1. An improved optical stepper apparatus used in a photolithography process for eliminating bias between dense and sparse photoresist patterns on a substrate, wherein the improvement comprises:

a first lens on an optical axis between a mask and a substrate;

an attenuator, located on the optical axis at a distance substantially equal to the first lens's focal length from the first lens between a radiation source and the substrate, wherein the attenuator attenuates the intensity of the low, spatial frequency radiation passing through the attenuator; and a second lens at a distance substantially equal to the second lens's focal length from the attenuator.

2. The apparatus of claim 1 wherein the attenuator includes a transparent region and an attenuating region.

3. The apparatus of claim 2 wherein the attenuating region of the attenuator comprises covering the attenuator with at least one substance that can block radiation.

4. The apparatus of claim 3 wherein the at least one substance comprises silver.

5. The apparatus of claim 2 wherein the attenuating region is located substantially in the center of the attenuator around the optical axis.

6. The apparatus of claim 5 wherein the attenuating region of the attenuator comprises at least one substance placed on the attenuator, which can block radiation.

7. The apparatus of claim 6 wherein the at least one substance placed on the attenuator comprises silver.

8. An apparatus for eliminating bias between dense and sparse photoresist patterns on a substrate, the apparatus comprising:

a mask having at least one dense mask pattern and at least one sparse mask pattern, wherein the mask is located between a radiation source and the substrate, so as to project the at least one dense mask pattern and the at least pattern onto the substrate;

a first lens between the mask and the substrate, wherein the first lens focuses radiation passing through the mask;

an attenuator located between the first lens and the substrate, at a distance substantially equal to the first len's focal length from the first lens, wherein the attentuator attentuates the the intensity of the radiation; and a second lens between the attenuator and the substrate, at a distance substatially equal to the second lens' focal length from the attenuator, wherein the second lens projects radiation passing through the attenuator on substrate.

9. The method of claim 8 wherein the substrate comprises a positive photoresist layer and a central region of the attenuator attenuates the at least one dense mask patterns having low spatial frequencies.

10. The method of claim 8 wherein the substrate comprises a negative photoresist layer and a central region of the attenuator attenuates the at least one sparse mask patterns having low spatial frequencies.

* * * * *

UNITED STATES PATENT AND TRADEMARK OFFICE
CERTIFICATE OF CORRECTION

PATENT NO. : 6,441,883 B1
DATED : August 27, 2002
INVENTOR(S) : C.-T. Yeh

It is certified that error appears in the above-identified patent and that said Letters Patent is hereby corrected as shown below:

<u>Title page,</u>
Item [73], Assignee, "ProMos" should read -- ProMOS --

<u>Column 5,</u>
Line 24, "low, spatial" should read -- low spatial --

<u>Column 6,</u>
Line 14, "least pattern" should read -- least one sparse mask pattern --
Line 19, "substrate, at" should read -- substrate at --
Line 20, "len's" should read -- lens's --
Line 21, delete second occurrence of "the"
Line 23, "substrate, at" should read -- substrate at --

Signed and Sealed this

Fourth Day of March, 2003

JAMES E. ROGAN
*Director of the United States Patent and Trademark Office*